US012424262B2

(12) United States Patent
Han (10) Patent No.: US 12,424,262 B2
(45) Date of Patent: Sep. 23, 2025

(54) VOLTAGE SUPPLY STRUCTURE FOR MEMORY CELL CAPABLE OF SECURING AREA MARGIN, SEMICONDUCTOR APPARATUS INCLUDING THE SAME, AND OPERATING METHOD OF THE SEMICONDUCTOR APPARATUS

(71) Applicant: SK hynix Inc., Icheon (KR)

(72) Inventor: Eun Gu Han, Icheon (KR)

(73) Assignee: SK hynix Inc., Icheon (KR)

(*) Notice: Subject to any disclaimer, the term of this patent is extended or adjusted under 35 U.S.C. 154(b) by 174 days.

(21) Appl. No.: 18/334,962

(22) Filed: Jun. 14, 2023

(65) Prior Publication Data
US 2024/0221816 A1 Jul. 4, 2024

(30) Foreign Application Priority Data
Jan. 3, 2023 (KR) .......................... 10-2023-0000659

(51) Int. Cl.
*G11C 11/4074* (2006.01)
*G11C 11/408* (2006.01)
*G11C 11/4094* (2006.01)

(52) U.S. Cl.
CPC ...... *G11C 11/4074* (2013.01); *G11C 11/4085* (2013.01); *G11C 11/4094* (2013.01)

(58) Field of Classification Search
CPC ............ G11C 11/4074; G11C 11/4085; G11C 11/4094; G11C 7/12; G11C 5/02; G11C 5/14; G11C 5/147; G11C 8/08; G11C 13/0038; G11C 13/0026; G11C 13/0028
See application file for complete search history.

(56) References Cited

U.S. PATENT DOCUMENTS 9,741,433 B2 8/2017 Castro
2008/0279017 A1* 11/2008 Shimano .................. G11C 5/14
365/230.03

FOREIGN PATENT DOCUMENTS

KR 1020160050400 B1 5/2016

* cited by examiner

*Primary Examiner* — Sultana Begum (57) ABSTRACT

A voltage supply structure may include a first global switch that connects a global positive line and a local positive line in response to a first common address signal, a first local column switch that connects the local positive line and a bit line in response to a first local column address signal, a first local row switch that connects the local positive line and a word line in response to a first local row address signal, and a memory cell connected between the bit line and the word line.

11 Claims, 6 Drawing Sheets

VOLTAGE SUPPLY STRUCTURE FOR MEMORY CELL CAPABLE OF SECURING AREA MARGIN, SEMICONDUCTOR APPARATUS INCLUDING THE SAME, AND OPERATING METHOD OF THE SEMICONDUCTOR APPARATUS

CROSS-REFERENCE TO RELATED APPLICATION

This application claims priority under 35 U.S.C. § 119 to Korean Patent Application No. 10-2023-0000659 filed on Jan. 3, 2023, which is incorporated herein by reference in its entirety.

BACKGROUND

1. Technical Field

Embodiments of the present disclosure relate to an integrated circuit technology, and more particularly, to a voltage supply structure for a memory cell capable of securing an area margin in a peripheral region, a semiconductor device including the same, and an operating method of the semiconductor device.

2. Related Art

Recently, with the miniaturization, low power consumption, high performance, and diversification of electronic devices, there is a demand for semiconductor devices capable of storing information in various electronic devices such as computers and portable communication devices. Accordingly, research on semiconductor devices capable of storing data by using characteristics of switching between different resistance states according to an applied voltage or current is being conducted. Examples of such semiconductor devices include a resistive random access memory (RRAM), a phase-change random access memory (PRAM), a ferroelectric random access memory (FRAM), a magnetic random access memory (MRAM), and an E-fuse.

SUMMARY

In an embodiment, a voltage supply structure may include a first global switch that connects a global positive line and a local positive line in response to a first common address signal, a first local column switch that connects the local positive line and a bit line in response to a first local column address signal, a first local row switch that connects the local positive line and a word line in response to a first local row address signal, and a memory cell connected between the bit line and the word line.

In an embodiment, a semiconductor device may include a current direction control circuit that outputs one of a global column address signal and a global row address signal as a common address signal based on a level of data, and a voltage supply structure including a global switch that connects a global line and a local line in response to the common address signal, a local column switch that connects the local line and a bit line in response to a local column address signal, a local row switch that connects the local line and a word line in response to a local row address signal, and a memory cell connected between the bit line and the word line.

In an embodiment, an operating method of a semiconductor device may include determining a level of data to be stored in a memory cell, outputting one of a global column address signal and a global row address signal as a common address signal according to a result of determining the level of the data, connecting a global line and a local line in response to the common address signal, and connecting one of a bit line and a word line to the local line in response to a row address signal.

DETAILED DESCRIPTION

Various embodiments are directed to a voltage supply structure that supplies a forward current and a reverse current to a memory cell while securing an area margin, a semiconductor device including the same, and an operating method of the semiconductor device.

There is an effect capable of improving an area margin of a semiconductor device.

Hereafter, embodiments in accordance with the technical spirit of the present disclosure will be described with reference to the accompanying drawings.

Figure 1A:
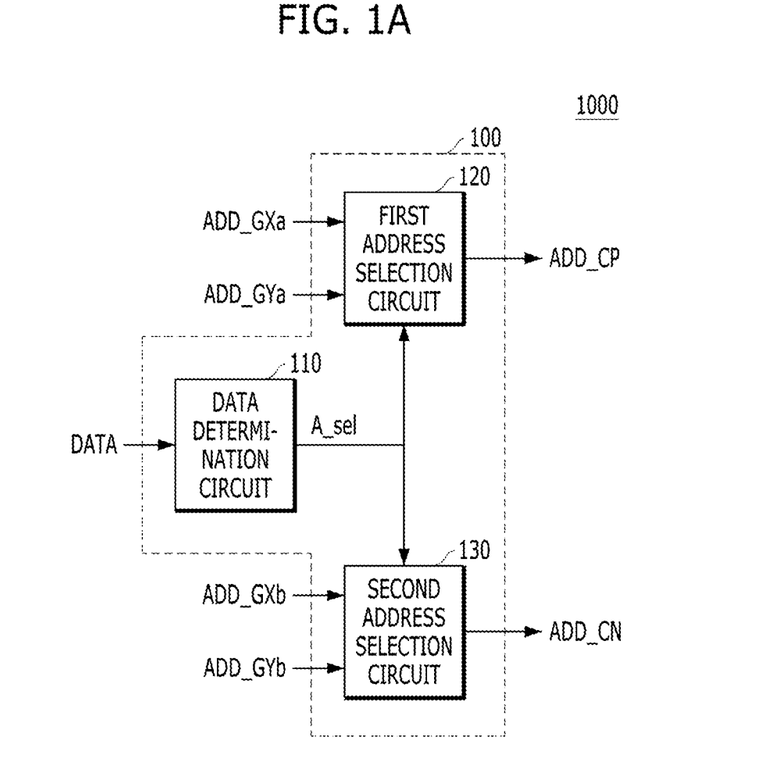
FIGS. 1A and 1B illustrate a semiconductor device in accordance with an embodiment of the present disclosure.
Figure 1B:
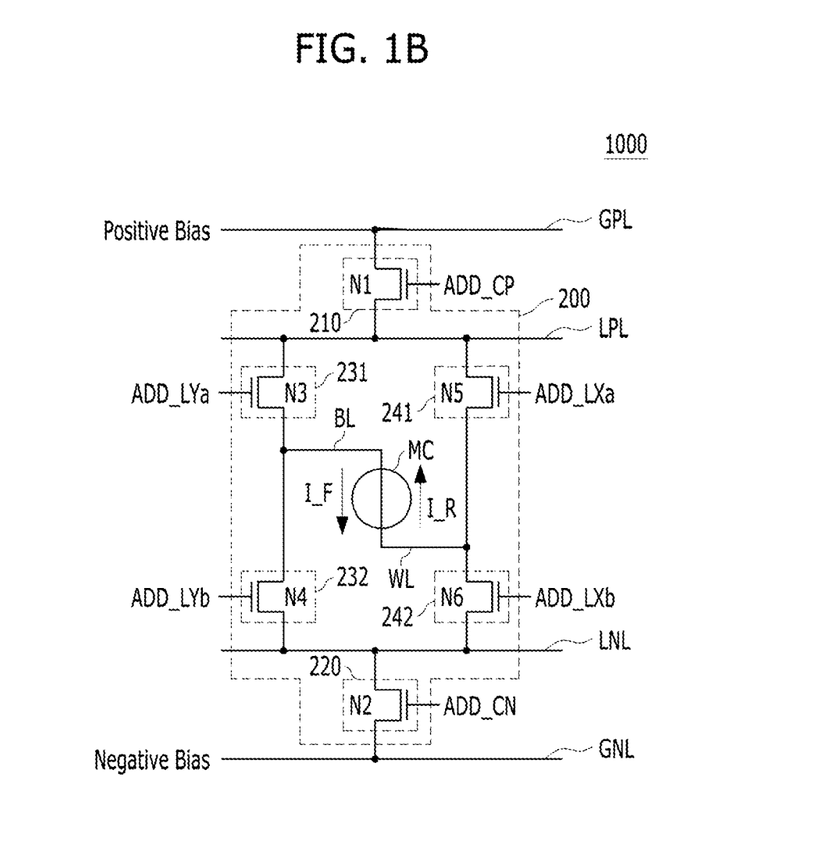

FIGS. 1A and 1B illustrate a semiconductor device 1000 in accordance with an embodiment of the present disclosure.

Referring to FIGS. 1A and 1B, the semiconductor device 1000 may change a direction of a current (I_F or I_R) flowing through a memory cell MC on the basis of data DATA to be stored in the memory cell MC. In such a case, the semiconductor device 1000 may select one of a plurality of memory cells based on row address signals and column address signals. The semiconductor device 1000 may control a forward current I_F or a reverse current I_R to flow through the selected memory cell MC on the basis of the data DATA. Depending on the direction of the current flowing through the memory cell MC, a level of data DATA stored in the memory cell MC may be changed. In such a case, the memory cell MC may be a self-selecting memory that may include a chalcogenide alloy, and the memory cell MC may be changed to a set state or a reset state according to the polarity of an applied voltage. The polarity of the applied voltage is determined according to the direction of the current.

The row address signals may include global row address signals ADD_GXa and ADD_GXb and local row address signals ADD_LXa and ADD_LXb. The column address signals may include global column address signals ADD_GYa and ADD_GYb and local column address signals ADD_LYa and ADD_LYb.

The semiconductor device 1000 may include a current direction control circuit 100 and a voltage supply structure 200.

Referring to FIG. 1A, the current direction control circuit 100 may select one of the global row address signals ADD_GXa and ADD_GXb and one of the global column address signals ADD_GYa and ADD_GYb on the basis of the data DATA, and output the selected address signals as common address signals ADD_CP and ADD_CN, respectively.

For example, the current direction control circuit 100 may select one of a first global row address signal ADD_GXa and a first global column address signal ADD_GYa on the basis of the level of the data DATA, and output the selected address signal as a first common address signal ADD_CP. The current direction control circuit 100 may also select one of a second global row address signal ADD_GXb and a second global column address signal ADD_GYb on the basis of the level of the data DATA, and output the selected address signal as a second common address signal ADD_CN.

More specifically, for example, when the current direction control circuit 100 outputs the first global column address signal ADD_GYa as the first common address signal ADD_CP on the basis of the level of the data DATA, the current direction control circuit 100 may output the second global row address signal ADD_GXb as the second common address signal ADD_CN. On the other hand, when the current direction control circuit 100 outputs the first global row address signal ADD_GXa as the first common address signal ADD_CP on the basis of the level of the data DATA, the current direction control circuit 100 may output the second global column address signal ADD_GYb as the second common address signal ADD_CN.

The current direction control circuit 100 may include a data determination circuit 110, a first address selection circuit 120, and a second address selection circuit 130.

The data determination circuit 110 may generate a selection signal A_sel on the basis of the level of the data DATA.

For example, the data determination circuit 110 may generate the selection signal A_sel that is enabled or disabled on the basis of the level of the data DATA.

The first address selection circuit 120 may output one of the first global row address signal ADD_GXa and the first global column address signal ADD_GYa as the first common address signal ADD_CP in response to the selection signal A_sel.

For example, when the selection signal A_sel is enabled, the first address selection circuit 120 may output the first global column address signal ADD_GYa as the first common address signal ADD_CP. On the other hand, when the selection signal A_sel is disabled, the first address selection circuit 120 may output the first global row address signal ADD_GXa as the first common address signal ADD_CP.

The second address selection circuit 130 may output one of the second global row address signal ADD_GXb and the second global column address signal ADD_GYb as the second common address signal ADD_CN in response to the selection signal A_sel.

For example, when the selection signal A_sel is enabled, the second address selection circuit 130 may output the second global row address signal ADD_GXb as the second common address signal ADD_CN. On the other hand, when the selection signal A_sel is disabled, the second address selection circuit 130 may output the second global column address signal ADD_GYb as the second common address signal ADD_CN.

Each of the first and second address selection circuits 120 and 130 may include a multiplexer.

The current direction control circuit 100 may enable or disable the selection signal A_sel on the basis of the level of the data DATA. When the selection signal A_sel is enabled according to the level of the data DATA, the current direction control circuit 100 may output the first global column address signal ADD_GYa as the first common address signal ADD_CP, and output the second global row address signal ADD_GXb as the second common address signal ADD_CN. When the selection signal A_sel is disabled according to the level of the data DATA, the current direction control circuit 100 may output the first global row address signal ADD_GXa as the first common address signal ADD_CP, and output the second global column address signal ADD_GYb as the second common address signal ADD_CN.

The operations of the data determination circuit 110, the first address selection circuit 120, and the second address selection circuit 130 included in the current direction control circuit 100 may be shown in Table 1.

TABLE 1

|  | A_sel | ADD_CP | ADD_CN |
|---|---|---|---|
| DATA | Enable | ADD_GYa | ADD_GXb |
|  | Disable | ADD_GXa | ADD_GYb |

Referring to FIG. 1B, the voltage supply structure 200 may supply voltages having different polarities to a bit line BL and a word line WL connected to the selected memory cell MC. In such a case, the voltage supply structure 200 may select the bit line BL and the word line WL and change the polarity of a voltage supplied to each of the selected bit line BL and the selected word line WL on the basis of the first common address signal ADD_CP, the second common address signal ADD_CN, a first local row address signal ADD_LXa, a second local row address signal ADD_LXb, a first local column address signal ADD_LYa, and a second local column address signal ADD_LYb.

The voltage supply structure 200 may include a first global switch 210, a second global switch 220, a first local column switch 231, a second local column switch 232, a first local row switch 241, and a second local row switch 242.

The first global switch 210 may electrically connect a global positive line GPL and a local positive line LPL in response to the first common address signal ADD_CP. In such a case, the global positive line GPL may be a line that receives a positive bias voltage Positive Bias, and the local positive line LPL may be a line that receives the positive bias voltage Positive Bias from the global positive line GPL through the first global switch 210 that is turned on by the first common address signal ADD_CP.

For example, the first global switch 210 may include a first transistor N1.

The first transistor N1 may receive the first common address signal ADD_CP through a gate thereof, and the global positive line GPL and the local positive line LPL may be connected to a drain and a source of the first transistor N1, respectively.

The second global switch 220 may electrically connect a global negative line GNL and a local negative line LNL in response to the second common address signal ADD_CN. In such a case, the global negative line GNL may be a line that receives a negative bias voltage Negative Bias, and the local negative line LNL may be a line that receives the negative bias voltage Negative Bias from the global negative line GNL through the second global switch 220 that is turned on by the second common address signal ADD_CN.

For example, the second global switch 220 may include a second transistor N2.

The second transistor N2 may receive the second common address signal ADD_CN through a gate thereof, and the global negative line GNL and the local negative line LNL may be connected to a drain and a source of the second transistor N2, respectively.

The first local column switch 231 may electrically connect the local positive line LPL and the bit line BL in response to the first local column address signal ADD_LYa. In such a case, the bit line BL may be a line connected to the memory cell MC.

For example, the first local column switch 231 may be turned on by the first local column address signal ADD_LYa, and the turned-on first local column switch 231 may electrically connect the local positive line LPL and the bit line BL. In such a case, when the positive bias voltage Positive Bias is provided to the local positive line LPL, the bit line BL may receive the positive bias voltage Positive Bias through the turned-on first local column switch 231.

The first local column switch 231 may include a third transistor N3.

The third transistor N3 may receive the first local column address signal ADD_LYa through a gate thereof, and the local positive line LPL and the bit line BL may be connected to a drain and a source of the third transistor N3, respectively.

The second local column switch 232 may electrically connect the local negative line LNL and the bit line BL in response to the second local column address signal ADD_LYb.

For example, the second local column switch 232 may be turned on by the second local column address signal ADD_LYb, and the turned-on second local column switch 232 may electrically connect the local negative line LNL and the bit line BL. In such a case, when the negative bias voltage Negative Bias is provided to the local negative line LNL, the bit line BL may receive the negative bias voltage Negative Bias through the turned-on second local column switch 232.

The second local column switch 232 may include a fourth transistor N4.

The fourth transistor N4 may receive the second local column address signal ADD_LYb through a gate thereof, and the local negative line LNL and the bit line BL may be connected to a drain and a source of the fourth transistor N4, respectively.

The first local row switch 241 may electrically connect the local positive line LPL and the word line WL in response to the first local row address signal ADD_LXa. In such a case, the word line WL may be a line connected to the memory cell MC.

For example, the first local row switch 241 may be turned on by the first local row address signal ADD_LXa, and the turned-on first local row switch 241 may electrically connect the local positive line LPL and the word line WL. In such a case, when the positive bias voltage Positive Bias is provided to the local positive line LPL, the word line WL may receive the positive bias voltage Positive Bias through the turned-on first local row switch 241.

The first local row switch 241 may include a fifth transistor N5.

The fifth transistor N5 may receive the first local row address signal ADD_LXa through a gate thereof, and the local positive line LPL and the word line WL may be connected to a drain and a source of the fifth transistor N5, respectively.

The second local row switch 242 may electrically connect the local negative line LNL and the word line WL in response to the second local row address signal ADD_LXb.

For example, the second local row switch 242 may be turned on by the second local row address signal ADD_LXb, and the turned-on second local row switch 242 may electrically connect the local negative line LNL and the word line WL. In such a case, when the negative bias voltage Negative Bias is provided to the local negative line LNL, the word line WL may receive the negative bias voltage Negative Bias through the turned-on second local row switch 242.

The second local row switch 242 may include a sixth transistor N6.

The sixth transistor N6 may receive the second local row address signal ADD_LXb through a gate thereof, and the local negative line LNL and the word line WL may be connected to a drain and a source of the sixth transistor N6, respectively.

An operation of the semiconductor device 1000 configured in this way will be described hereinafter.

First, it is assumed that when the data DATA having a first level is input to the semiconductor device, the forward current I_F flows from the bit line BL to the word line WL through the memory cell MC.

In this case, the data determination circuit 110 may enable the selection signal A_sel on the basis of the first level of the data DATA.

The first address selection circuit 120 may output the first global column address signal ADD_GYa as the first common address signal ADD_CP.

The second address selection circuit 130 may output the second global row address signal ADD_GXb as the second common address signal ADD_CN.

That is, when the data DATA incurring the forward current I_F is input, the current direction control circuit 100 including the data determination circuit 110, the first address selection circuit 120, and the second address selection circuit 130 may output the first global column address signal ADD_GYa as the first common address signal ADD_CP, and output the second global row address signal ADD_GXb as the second common address signal ADD_CN.

The first global switch 210 may be turned on under the control of the first common address signal ADD_CP (that is, ADD_GYa) to electrically connect the global positive line GPL and the local positive line LPL. In such a case, the positive bias voltage Positive Bias applied to the global positive line GPL may be provided to the local positive line LPL.

The second global switch 220 may be turned on under the control of the second common address signal ADD_CN (that is, ADD_GXb) to electrically connect the global negative line GNL and the local negative line LNL. In such a case, the negative bias voltage Negative Bias applied to the global negative line GNL may be provided to the local negative line LNL.

The first local column switch 231 may be turned on under the control of the first local column address signal ADD_LYa, which corresponds to the first global column address signal ADD_GYa that is determined as the first common address signal ADD_CP, to electrically connect the local positive line LPL to the bit line BL. In such a case, the bit line BL may receive the positive bias voltage Positive Bias from the local positive line LPL.

The second local row switch 242 may be turned on under the control of the second local row address signal ADD_LXb, which corresponds to the second global row address signal ADD_GXb that is determined as the second common address signal ADD_CN, to electrically connect the local negative line LNL to the word line WL. In such a case, the word line WL may receive the negative bias voltage Negative Bias from the local negative line LNL.

In this case, the second local column switch 232 and the first local row switch 241 may be turned off.

Accordingly, in the memory cell MC connected between the bit line BL receiving the positive bias voltage Positive Bias and the word line WL receiving the negative bias voltage Negative Bias, the forward current I_F may flow from the bit line BL to the word line WL.

Next, it is assumed that when the data DATA having a second level is input to the semiconductor device, the reverse current I_R flows from the word line WL to the bit line BL through the memory cell MC.

In this case, the data determination circuit 110 may disable the selection signal A_sel on the basis of the second level of the data DATA.

The first address selection circuit 120 may output the first global row address signal ADD_GXa as the first common address signal ADD_CP.

The second address selection circuit 130 may output the second global column address signal ADD_GYb as the second common address signal ADD_CN.

That is, when the data DATA incurring the reverse current I_R is input, the current direction control circuit 100 including the data determination circuit 110, the first address selection circuit 120, and the second address selection circuit 130 may output the first global row address signal ADD_GXa as the first common address signal ADD_CP, and output the second global column address signal ADD_GYb as the second common address signal ADD_CN.

The first global switch 210 may be turned on under the control of the first common address signal ADD_CP (that is, ADD_GXa) to electrically connect the global positive line GPL and the local positive line LPL. In such a case, the positive bias voltage Positive Bias applied to the global positive line GPL may be provided to the local positive line LPL.

The second global switch 220 may be turned on under the control of the second common address signal ADD_CN (that is, ADD_GYb) to electrically connect the global negative line GNL and the local negative line LNL. In such a case, the negative bias voltage Negative Bias applied to the global negative line GNL may be provided to the local negative line LNL.

The first local row switch 241 may be turned on under the control of the first local row address signal ADD_LXa, which corresponds to the first global row address signal ADD_GXa that is determined as the first common address signal ADD_CP, to electrically connect the local positive line LPL to the word line WL. In such a case, the word line WL may receive the positive bias voltage Positive Bias from the local positive line LPL.

The second local column switch 232 may be turned on under the control of the second local column address signal ADD_LYb, which corresponds to the second global column address signal ADD_GYb that is determined as the second common address signal ADD_CN, to electrically connect the local negative line LNL to the bit line BL. In such a case, the bit line BL may receive the negative bias voltage Negative Bias from the local negative line LNL.

In this case, the first local column switch 231 and the second local row switch 242 may be turned off.

Accordingly, in the memory cell MC connected between the word line WL receiving the positive bias voltage Positive Bias and the bit line BL receiving the negative bias voltage Negative Bias, the reverse current I_R may flow from the word line WL to the bit line BL.

Table 2 shows turn-on and turn-off states of the first to sixth transistors N1 to N6 when the voltage supply structure 200 allows the forward current I_F or the reverse current I_R to flow through the memory cell MC.

TABLE 2

|  | N1 | N2 | N3 | N4 | N5 | N6 |
| --- | --- | --- | --- | --- | --- | --- |
| I_F | ON | ON | ON | OFF | OFF | ON |
| I_R | ON | ON | OFF | ON | ON | OFF |

A semiconductor device is generally configured to select one of a plurality of memory cells, in which data is to be stored, on the basis of row address signals and column address signals, and to allow a forward current or a reverse current to flow through the selected memory cell according to a level of the data to be stored in the selected memory cell. In such a case, the row address signals are signals for selecting one word line connected to the selected memory cell among a plurality of word lines, and the column address signals are signals for selecting one bit line connected to the selected memory cell among a plurality of bit lines.

The semiconductor device is configured such that a positive bias voltage is applied to the selected bit line and a negative bias voltage is applied to the selected word line so that a forward current may flow from the selected bit line to the selected word line through the selected memory cell. The semiconductor device is also configured such that the positive bias voltage is applied to the selected word line and the negative bias voltage is applied to the selected bit line so that a reverse current may flow from the selected word line to the selected bit line through the selected memory cell.

A general voltage supply structure includes two global switches operating in response to row address signals in order to apply a positive bias voltage Positive Bias and a negative bias voltage Negative Bias to a selected word line, respectively. The general voltage supply structure also includes two global switches operating in response to column address signals in order to apply the positive bias voltage Positive Bias and the negative bias voltage Negative Bias to a selected bit line, respectively. Accordingly, the general voltage supply structure includes the four global switches.

However, the voltage supply structure 200 in accordance with the embodiment of the present disclosure may include the local positive line LPL and the local negative line LNL that may be electrically connected to the bit line BL and the word line WL, or the word line WL and the bit line BL, and include the first global switch 210 that provides the positive bias voltage Positive Bias to the local positive line LPL under the control of row address signals and column address signals and the second global switch 220 that provides the negative bias voltage Negative Bias to the local negative line LNL under the control of the row address signals and the column address signals.

Accordingly, the voltage supply structure 200 in accordance with the embodiment of the present disclosure includes a smaller number of global switches while performing substantially the same operation as the general voltage supply structure, thereby reducing an area where the global switches are disposed. As a result, it is possible to secure an area margin in a peripheral region of the semiconductor device.

Figure 2:
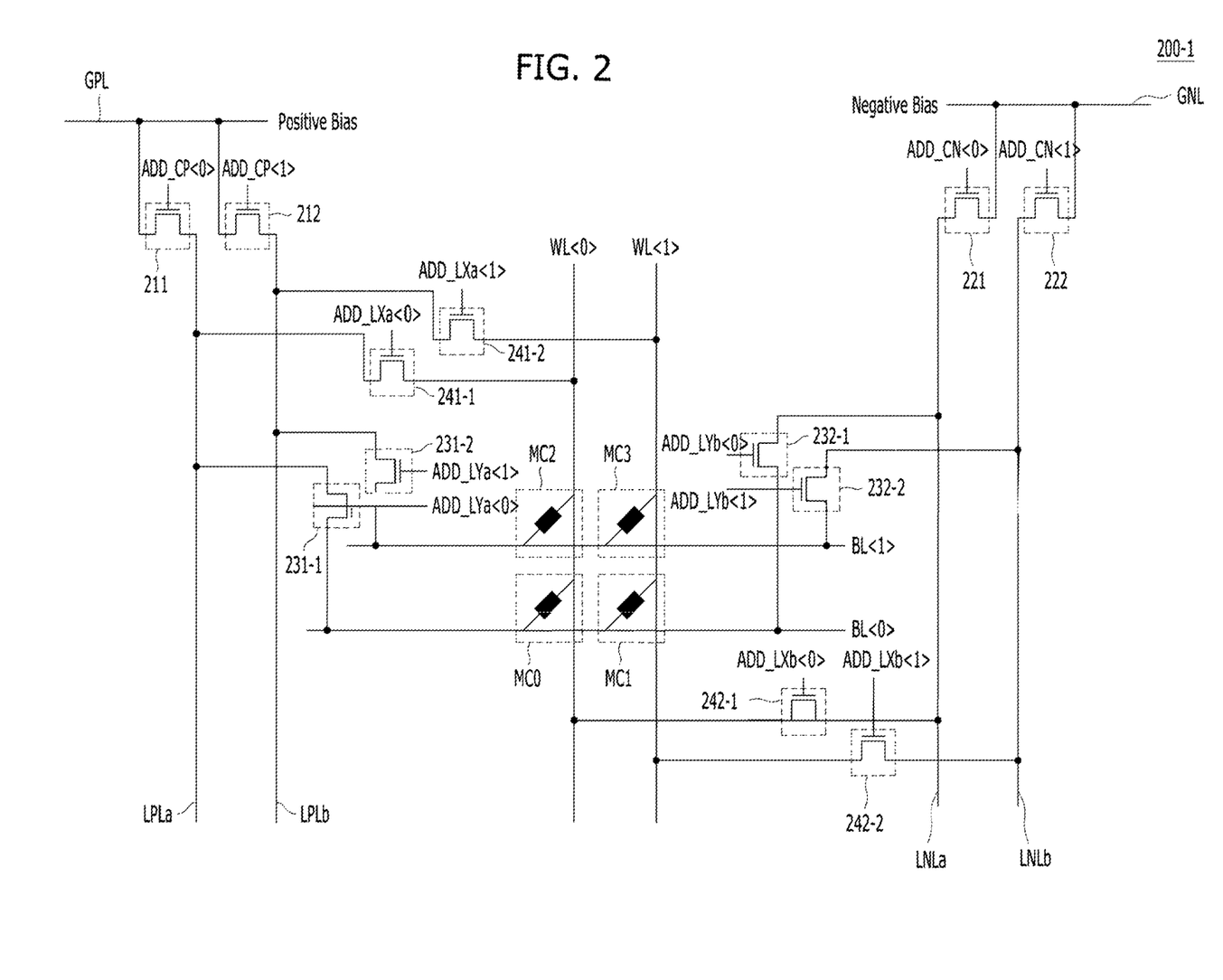
FIG. 2 illustrates a voltage supply structure for a memory cell in accordance with an embodiment of the present disclosure.

FIGS. 1A and 1B illustrate the configuration and operation of one memory cell in order to conceptually describe the semiconductor device 1000 in accordance with the embodiment of the present disclosure. FIG. 2 illustrates configurations and operations of a plurality of memory cells in order to more specifically describe the semiconductor device 1000 in accordance with an embodiment of the present disclosure.

FIG. 2 illustrates a voltage supply structure 200-1 for a plurality of memory cells in accordance with an embodiment of the present disclosure. FIG. 2 illustrates four memory cells for illustrative convenience. However, embodiments are not limited to the four memory cells.

Referring to FIG. 2, the voltage supply structure 200-1 may include a first-first global switch 211, a first-second global switch 212, a second-first global switch 221, a second-second global switch 222, a first-first local column switch 231-1, a first-second local column switch 231-2, a second-first local column switch 232-1, a second-second local column switch 232-2, a first-first local row switch 241-1, a first-second local row switch 241-2, a second-first local row switch 242-1, and a second-second local row switch 242-2.

The first-first global switch 211 may be configured to electrically connect a global positive line GPL and a first local positive line LPLa in response to a first-first common address signal ADD_CP<0>.

The first-second global switch 212 may be configured to electrically connect the global positive line GPL and a second local positive line LPLb in response to a first-second common address signal ADD_CP<1>.

The second-first global switch 221 may be configured to electrically connect a global negative line GNL and a first local negative line LNLa in response to a second-first common address signal ADD_CN<0>.

The second-second global switch 222 may be configured to electrically connect the global negative line GNL and a second local negative line LNLb in response to a second-second common address signal ADD_CN<1>.

The first-first local column switch 231-1 may be configured to electrically connect the first local positive line LPLa and a first bit line BL<0> in response to a first-first local column address signal ADD_LYa<0>.

The first-second local column switch 231-2 may be configured to electrically connect the second local positive line LPLb and a second bit line BL<1> in response to a first-second local column address signal ADD_LYa<1>.

The second-first local column switch 232-1 may be configured to electrically connect the first local negative line LNLa and the first bit line BL<0> in response to a second-first local column address signal ADD_LYb<0>.

The second-second local column switch 232-2 may electrically connect the second local negative line LNLb and the second bit line BL<1> in response to a second-second local column address ADD_LYb<1>.

The first-first local row switch 241-1 may electrically connect the first local positive line LPLa and a first word line WL<0> in response to a first-first local row address signal ADD_LXa<0>.

The first-second local row switch 241-2 may electrically connect the second local positive line LPLb and a second word line WL<1> in response to a first-second local row address signal ADD_LXa<1>.

The second-first local row switch 242-1 may electrically connect the first local negative line LNLa and the first word line WL<0> in response to a second-first local row address signal ADD_LXb<0>.

The second-second local row switch 242-2 may electrically connect the second local negative line LNLb and the second word line WL<1> in response to a second-second local row address signal ADD_LXb<1>.

A first memory cell MC0 may be connected between the first bit line BL<0> and the first word line WL<0>.

A second memory cell MC1 may be connected between the first bit line BL<0> and the second word line WL<1>.

A third memory cell MC2 may be connected between the second bit line BL<1> and the first word line WL<0>.

A fourth memory cell MC3 may be connected between the second bit line BL<1> and the second word line WL<1>.

The voltage supply structure 200-1 may have the same configuration principle as the voltage supply structure 200 illustrated in FIG. 1B.

More specifically, as in the voltage supply structure 200 illustrated in FIG. 1B, the voltage supply structure 200-1 illustrated in FIG. 2 may include one global switch 211 or 212 for electrically connecting one local positive line LPLa or LPLb and the global positive line GPL, one local column switch 231-1 or 231-2 for connecting one local positive line LPLa or LPLb and one bit line BL<0> or BL<1>, and one local row switch 241-1 or 241-2 for connecting one local positive line LPLa or LPLb and one word line WL<0> or WL<1>. The voltage supply structure 200-1 illustrated in FIG. 2 may also include one global switch 221 or 222 for connecting one local negative line LNLa or LNLb and the global negative line GNL, one local column switch 232-1 or 232-2 for connecting one local negative line LNLa or LNLb and one bit line BL<0> or BL<1>, and one local row switch 242-1 or 242-2 for connecting one local negative line LNLa or LNLb and one word line WL<0> or WL<1>.

Summarizing the characteristics of the voltage supply structures 200 and 200-1 illustrated in FIG. 1B and FIG. 2 in accordance with the present disclosure, the voltage supply structure may include one global switch for connecting one local line and one global line, and one of a bit line and a word line may be configured to be selectively connected to one local line. In such a case, the global switch of each of the voltage supply structures 200 and 200-1 may be configured to be controlled by the global column address signal or the global row address signal.

Furthermore, the first-first common address signal ADD_CP<0>, the first-second common address signal ADD_CP<1>, the second-first common address signal ADD_CN<0>, and the second-second common address signal ADD_CN<1> of the voltage supply structure 200-1 illustrated in FIG. 2 may be generated in the same manner as the first common address signal ADD_CP and the second common address signal ADD_CN shown in Table 1. These are summarized in Table 3 and Table 4 as follows.

TABLE 3

|  | A_sel | ADD_CP<0> | ADD_CN<0> |
|---|---|---|---|
| DATA | Enable | ADD_GYa<0> | ADD_GXb<0> |
|  | Disable | ADD_GXa<0> | ADD_GYb<0> |

TABLE 4

|  | A_sel | ADD_CP<1> | ADD_CN<1> |
|---|---|---|---|
| DATA | Enable | ADD_GYa<1> | ADD_GXb<1> |
|  | Disable | ADD_GXa<1> | ADD_GYb<1> |

Figure 3:
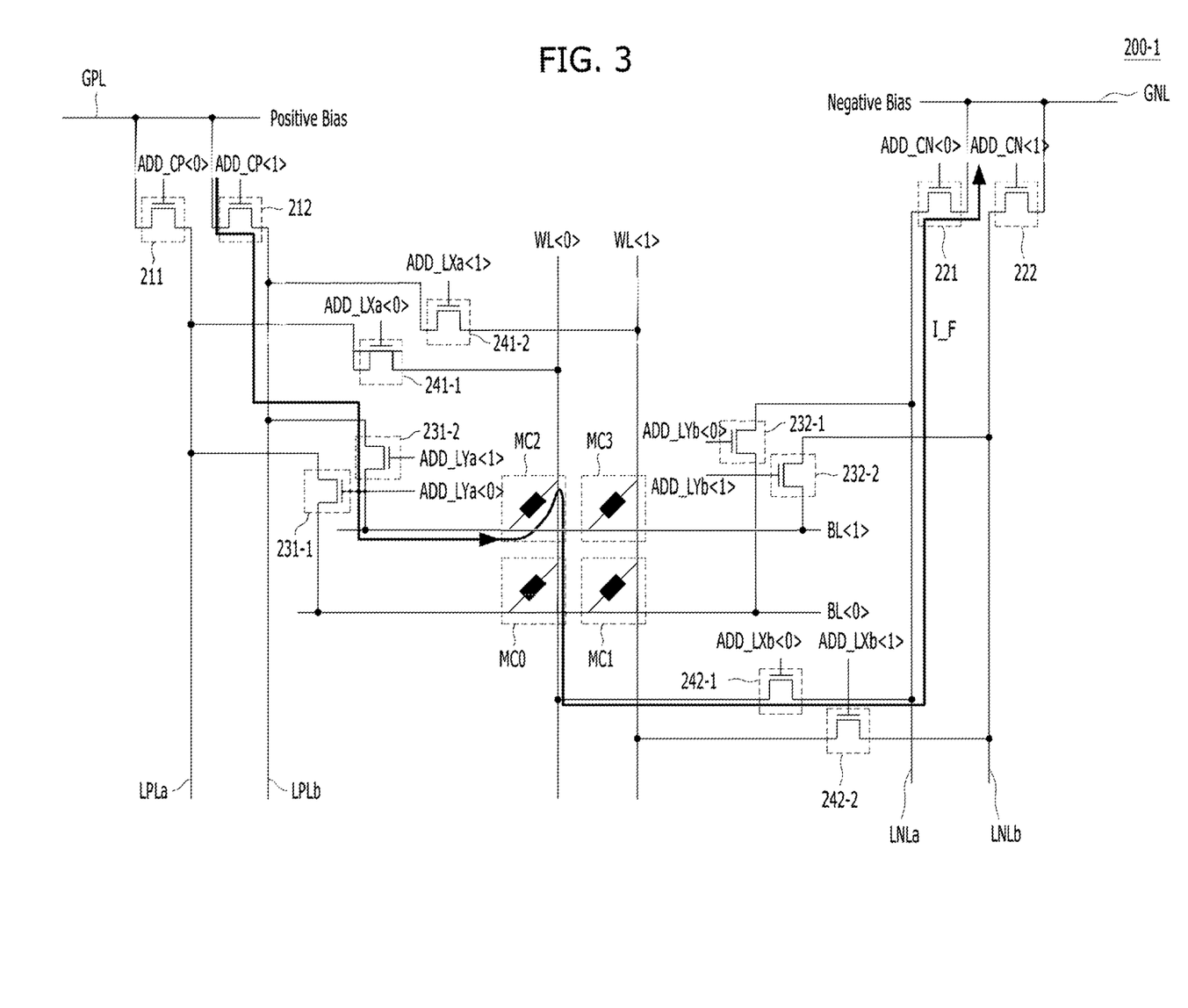
FIG. 3 and FIG. 4 illustrate an operation of the voltage supply structure of FIG. 2 in accordance with an embodiment of the present disclosure.
Figure 4:
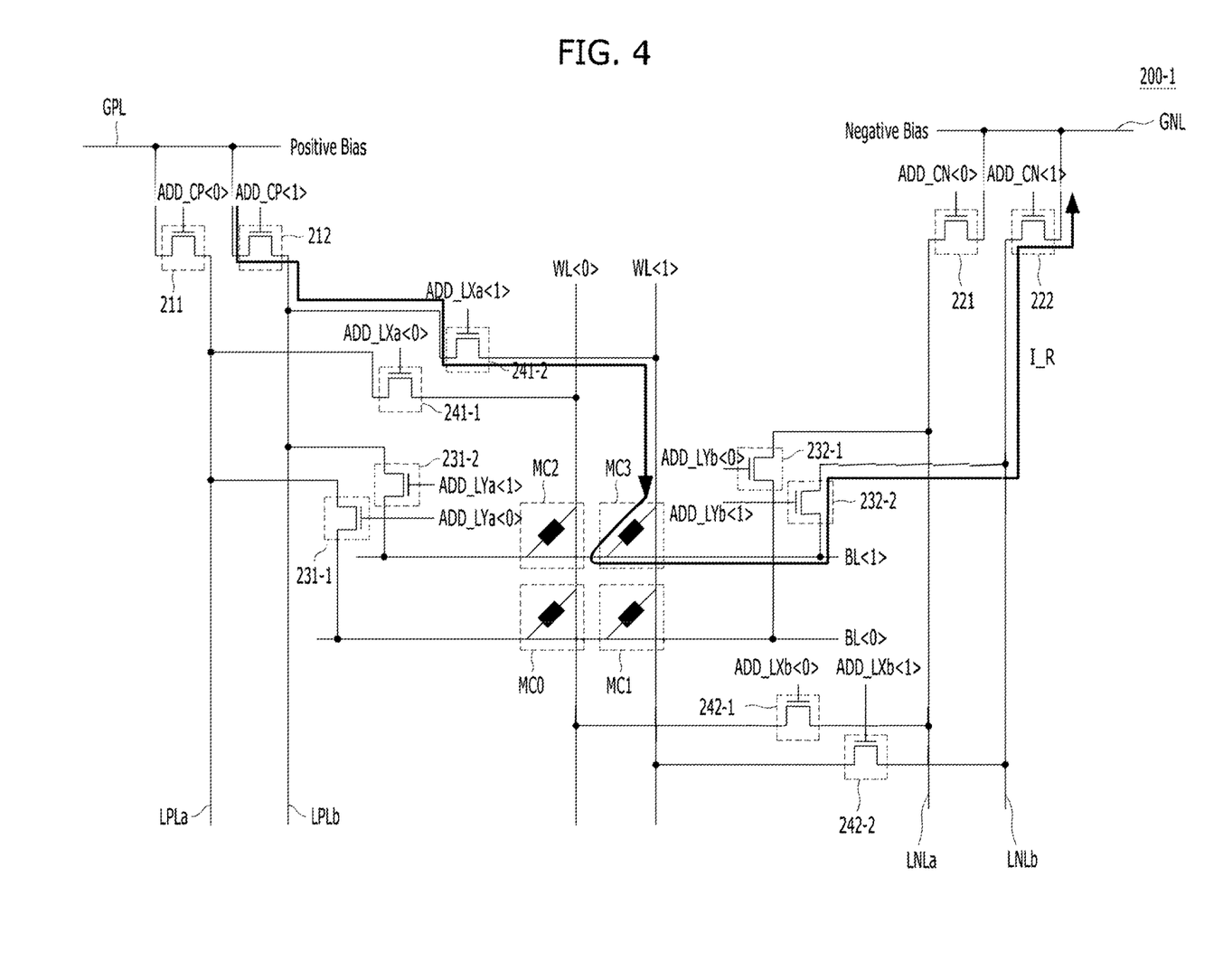

FIG. 3 and FIG. 4 each illustrate an operation of a voltage supply structure for a memory cell in accordance with an embodiment of the present disclosure.

An operation of the voltage supply structure 200-1 shown in FIG. 2 will be described with reference to FIG. 3 and FIG. 4.

FIG. 3 illustrates a case where the forward current I_F flows through the third memory cell MC2 among the first to fourth memory cells MC0 to MC3.

Referring to FIG. 3, the first-second global switch 212 may be turned on by the first-second common address signal ADD_CP<1>. The turned-on first-second global switch 212 may connect the global positive line GPL and the second local positive line LPLb. In such a case, the first-second common address signal ADD_CP<1> may be the first-second global column address signal ADD_GYa<1>.

In this case, the first-second local column switch 231-2 may be turned on by the first-second local column address ADD_LYa<1> corresponding to the first-second global column address signal ADD_GYa<1> that is determined as the first-second common address signal ADD_CP<1>. The turned-on first-second local column switch 231-2 may connect the second local positive line LPLb and the second bit line BL<1>.

As a consequence, the positive bias voltage Positive Bias may be provided to the second bit line BL<1> under the control of the first-second global column address signal ADD_GYa<1> and the first-second local column address signal ADD_LYa<1>.

More specifically, the second bit line BL<1> may be selected by the first-second global column address signal ADD_GYa<1> and the first-second local column address signal ADD_LYa<1>, and the positive bias voltage Positive Bias may be provided to the selected bit line BL<1>.

The second-first global switch 221 may be turned on by the second-first common address signal ADD_CN<0>. The turned-on second-first global switch 221 may connect the global negative line GNL and the first local negative line LNLa. In such a case, the second-first common address signal ADD_CN<0> may be the second-first global row address signal ADD_GXb<0>.

The second-first local row switch 242-1 may be turned on by the second-first local row address signal ADD_LXb<0> corresponding to the second-first global row address signal ADD_GXb<0> that is determined as the second-first common address signal ADD_CN<0>. The turned-on second-first local row switch 242-1 may connect the first local negative line LNLa and the first word line WL<0>.

The voltage supply structure 200-1 may select the first word line WL<0> under the control of the second-first global row address signal ADD_GXb<0> and the second-first local row address signal ADD_LXb<0>, and provide the negative bias voltage Negative Bias to the selected word line WL<0>.

As a consequence, the positive bias voltage Positive Bias may be provided to the second bit line BL<1>, and the negative bias voltage Negative Bias may be provided to the first word line WL<0>, so that the forward current I_F may flow from the second bit line BL<1> to the first word line WL<0> through the third memory cell MC2 among the first to fourth memory cells MC0 to MC3.

FIG. 4 illustrates a case where the reverse current I_R flows through the fourth memory cell MC3 among the first to fourth memory cells MC0 to MC3.

Referring to FIG. 4, the first-second global switch 212 may be turned on by the first-second common address signal ADD_CP<1>. The turned-on first-second global switch 212 may connect the global positive line GPL and the second local positive line LPLb. In such a case, the first-second common address signal ADD_CP<1> may be the first-second global row address signal ADD_GXa<1>.

The first-second local row switch 241-2 may be turned on by the first-second local row address ADD_LXa<1> corresponding to the first-second global row address signal ADD_GXa<1> that is determined as the first-second common address signal ADD_CP<1>. The turned-on first-second local row switch 241-2 may connect the second local positive line LPLb and the second word line WL<1>.

As a consequence, the positive bias voltage Positive Bias may be provided to the second word line WL<1> under the control of the first-second global row address signal ADD_GXa<1> and the first-second local row address signal ADD_LXa<1>.

More specifically, the second word line WL<1> may be selected under the control of the first-second global row address signal ADD_GXa<1> and the first-second local row address signal ADD_LXa<1>, and the positive bias voltage Positive Bias may be provided to the selected word line WL<1>.

The second-second global switch 222 may be turned on by the second-second common address signal ADD_CN<1>. The turned-on second-second global switch 222 may connect the global negative line GNL and the second local negative line LNLb. In such a case, the second-second common address signal ADD_CN<1> may be the second-second global column address signal ADD_GYb<1>.

The second-second local column switch 232-2 may be turned on by the second-second local column address signal ADD_LYb<1> corresponding to the second-second global column address signal ADD_GYb<1> that is determined as the second-second common address signal ADD_CN<1>. The turned-on second-second local column switch 232-2 may connect the second local negative line LNLb and the second bit line BL<1>.

The voltage supply structure 200-1 may select the second bit line BL<1> under the control of the second-second global column address signal ADD_GYb<1> and the second-second local column address signal ADD_LYb<1>, and provide the negative bias voltage Negative Bias to the selected bit line BL<1>.

As a consequence, the positive bias voltage Positive Bias may be provided to the second word line WL<1>, and the negative bias voltage Negative Bias may be provided to the second bit line BL<1>, so that the reverse current I_R may flow from the second word line WL<1> to the second bit line BL<1> through the fourth memory cell MC3 among the first to fourth memory cells MC0 to MC3.

Figure 5:
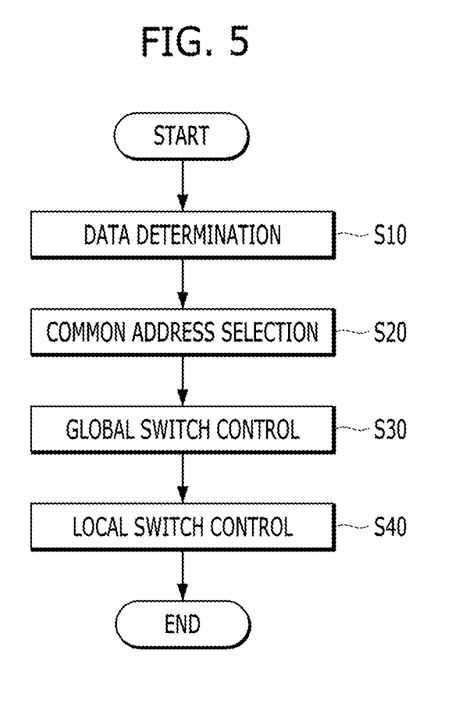
FIG. 5 is a flowchart for describing an operation of a semiconductor device in accordance with an embodiment of the present disclosure.

FIG. 5 is a flowchart for describing an operation of a semiconductor device in accordance with an embodiment of the present disclosure. The operation described in FIG. 5 will be described with reference to FIGS. 1A and 1B.

Referring to FIG. 5, the operating method of the semiconductor device may include a data determination operation S10, a common address selection operation S20, a global switch control operation S30, and a local switch control operation S40.

The data determination operation S10 may be performed by the data determination circuit 110, and may include an operation of determining a level of data DATA to be stored in a selected memory cell.

The common address selection operation S20 may be performed by the address selection circuits 120 and 130, and may include an operation of outputting one of a global column address signal and a global row address signal as a common address signal according to the data determination result of the data determination operation S10.

For example, the common address selection operation S20 may be performed by the first address selection circuit 120, and may include an operation of outputting one of the first global column address signal ADD_GYa and the first global row address signal ADD_GXa as the first common address signal ADD_CP on the basis of a data determination result, i.e., the selection signal A_sel. The common address selection operation S20 may also be performed by the second address selection circuit 130, and may further include an operation of outputting one of the second global column address signal ADD_GYb and the second global row address signal ADD_GXb as the second common address signal ADD_CN on the basis of the selection signal A_sel.

The global switch control operation S30 may include an operation of connecting a global line and a local line on the basis of each of the first and second common address signals ADD_CP and ADD_CN.

For example, the global switch control operation S30 may include an operation in which the first global switch 210 is turned on by the first common address ADD_CP and an operation in which the second global switch 220 is turned on by the second common address ADD_CN. In such a case, the positive bias voltage Positive Bias may be provided from the global positive line GPL to the local positive line LPL by the turned-on first global switch 210, and the negative bias voltage Negative Bias may be provided from the global negative line GNL to the local negative line LNL by the turned-on second global switch 220.

The local switch control operation S40 may include an operation of connecting one of a bit line and a word line to the local line on the basis of a local address signal.

For example, the local switch control operation S40 may include an operation in which the first local column switch 231 is turned on by the first local column address ADD_LYa to connect the local positive line LPL and the bit line BL, or the first local row switch 241 is turned on by the first local row address ADD_LXa to connect the local positive line LPL and the word line WL. The local switch control operation S40 may further include an operation in which the second local column switch 232 is turned on by the second local column address ADD_LYb to connect the local negative line LNL and the bit line BL, or the second local row switch 242 is turned on by the second local row address ADD_LXb to connect the local negative line LNL and the word line WL. In such a case, when the bit line BL is connected to the local positive line LPL, the word line WL is connected to the local negative line LNL. When the word line WL is connected to the local positive line LPL, the bit line BL is connected to the local negative line LNL.

As described above, the semiconductor device in accordance with the embodiment of the present disclosure uses a single global switch connecting a global line and a local line in response to one of a global column address signal and a global row address signal according to a level of data to be stored in a selected memory cell, thereby decreasing the number of global switches.

Although embodiments according to the technical idea of the present disclosure have been described above with reference to the accompanying drawings, this is only for explaining the embodiments according to the concept of the present disclosure, and the present disclosure is not limited to the above embodiments. Various types of substitutions, modifications, and changes for the embodiments may be made by those skilled in the art, to which the present disclosure pertains, without departing from the technical idea of the present disclosure defined in the following claims, and it should be construed that these substitutions, modifications, and changes belong to the scope of the present disclosure.

What is claimed is:

1. A voltage supply structure, comprising:
   a first global switch that connects a global positive line and a local positive line in response to a first common address signal;
   a first local column switch that connects the local positive line and a bit line in response to a first local column address signal;
   a first local row switch that connects the local positive line and a word line in response to a first local row address signal; and
   a memory cell connected between the bit line and the word line.

2. The voltage supply structure of claim 1, further comprising:
   a second global switch that connects a global negative line and a local negative line in response to a second common address signal;
   a second local column switch that connects the local negative line and the bit line in response to a second local column address signal; and
   a second local row switch that connects the local negative line and the word line in response to a second local row address signal.

3. The voltage supply structure of claim 2, wherein the first common address signal is one of a first global column address signal and a first global row address signal selected according to a level of data to be stored in the memory cell, and
   the second common address signal is one of a second global column address signal and a second global row address signal selected according to the level of the data to be stored in the memory cell.

4. The voltage supply structure of claim 2, wherein the global positive line receives a positive bias voltage, and the global negative line receives a negative bias voltage.

5. A semiconductor device comprising:
   a current direction control circuit that outputs one of a global column address signal and a global row address signal as a common address signal based on a level of data; and
   a voltage supply structure including a global switch that connects a global line and a local line in response to the common address signal, a local column switch that connects the local line and a bit line in response to a local column address signal, a local row switch that connects the local line and a word line in response to a local row address signal, and a memory cell connected between the bit line and the word line.

6. The semiconductor device of claim 5, wherein the global column address signal includes a first global column address signal and a second global column address signal, the global row address signal includes a first global row address signal and a second global row address signal, and
   the common address signal includes a first common address signal and a second common address signal.

7. The semiconductor device of claim 6, wherein the current direction control circuit comprises:
   a data determination circuit that generates a selection signal to be enabled or disabled based on the level of the data;

a first address selection circuit that outputs one of the first global column address signal and the first global row address signal as the first common address signal based on the selection signal; and a second address selection circuit that outputs one of the second global column address signal and the second global row address signal as the second common address signal based on the selection signal.

8. The semiconductor device of claim 7, wherein the first address selection circuit outputs the first global column address signal as the first common address signal when the selection signal is enabled, and the second address selection circuit outputs the second global row address signal as the second common address signal when the selection signal is enabled.

9. The semiconductor device of claim 7, wherein the first address selection circuit outputs the first global row address signal as the first common address signal when the selection signal is disabled, and the second address selection circuit outputs the second global column address signal as the second common address signal when the selection signal is disabled.

10. The semiconductor device of claim 6, wherein the global line includes a global positive line and a global negative line, the local line includes a local positive line and a local negative line, the global switch includes a first global switch and a second global switch, the local column switch includes a first local column switch and a second local column switch, and the local row switch includes a first local row switch and a second local row switch.

11. The semiconductor device of claim 10, wherein the voltage supply structure comprises:

the first global switch that connects the global positive line and the local positive line in response to the first common address signal;

the second global switch that connects the global negative line and the local negative line in response to the second common address signal;

the first local column switch that connects the local positive line and the bit line on the basis of the first local column address signal;

the second local column switch that connects the local negative line and the bit line in response to the second local column address signal;

the first local row switch that connects the local positive line and the word line in response to the first local row address signal; and the second local row switch that connects the local negative line and the word line in response to the second local row address signal.

* * * * *